United States Patent [19]
Wu et al.

[11] Patent Number: 6,031,856
[45] Date of Patent: Feb. 29, 2000

[54] METHOD, ARTICLE OF MANUFACTURE, AND OPTICAL PACKAGE FOR ELIMINATING TILT ANGLE BETWEEN A HEADER AND AN OPTICAL EMITTER MOUNTED THEREON

[75] Inventors: Sean Xin Wu, Palatine; Gary Mui, Wheeling; Chao-Pin Yeh, Schaumburg; Karl W. Wyatt, Cary, all of Ill.

[73] Assignee: Motorola, Inc., Schaumburg, Ill.

[21] Appl. No.: 08/961,105

[22] Filed: Oct. 30, 1997

[51] Int. Cl.[7] .............................. H01S 3/18; H01L 21/20
[52] U.S. Cl. .................................. 372/43; 438/25; 438/26
[58] Field of Search ........................ 372/43, 36; 257/99, 257/80, 81, 82; 438/25, 26

[56] References Cited

U.S. PATENT DOCUMENTS

| | | | |
|---|---|---|---|
| 5,285,466 | 2/1994 | Tabatabaie | 372/50 |
| 5,478,778 | 12/1995 | Tanisawa | 438/25 |
| 5,656,507 | 8/1997 | Welbourn et al. | 438/25 |
| 5,663,944 | 9/1997 | Mun | 369/121 |
| 5,761,229 | 6/1998 | Baldwin et al. | 372/36 |
| 5,801,402 | 9/1998 | Shin | 257/80 |

OTHER PUBLICATIONS

T. Kim, T.K. Kim, E.K. Lee, J.Y. Kim, and T.I. Kim, A Single Transverse Mode Operation of Top Surface Emitting Laser Diode with a Integrated photo–diode. Samsung Advanced Institute of Technology pp. 416–417. (no date available).

Primary Examiner—Rodney Bovernick
Assistant Examiner—Quyen Phan Leung
Attorney, Agent, or Firm—K. Cyrus Khosravi

[57] ABSTRACT

The present invention provides a method, article of manufacture, and optical package (24) for eliminating tilt angle (40) between an optical emitter (26) mounted on a carrier (28). The method, article of manufacture, and optical package (24) include a carrier (28) having a top surface (42) with a cavity (46) formed therein, an adhesive material (38) inserted into the cavity (46), and an optical emitter (26) placed on the top surface (42) of the carrier (28) and at least partially covering the cavity (46), thereby providing at least one egress point for overflowing said adhesive material therefrom.

9 Claims, 4 Drawing Sheets

METHOD, ARTICLE OF MANUFACTURE, AND OPTICAL PACKAGE FOR ELIMINATING TILT ANGLE BETWEEN A HEADER AND AN OPTICAL EMITTER MOUNTED THEREON

RELATED INVENTION

The present invention is related to the following invention which is assigned to the same assignee as the present invention:

"Device, Method, Bar Code Scanner and Optical Storage Unit for Providing Optical Feedback for an optical Emitter Using Holograms", having Ser. No. 08/682,973, disclosure no. SST96004, Yeh et al., filed on Jul. 16, 1996.

The subject mater of the above-identified related invention is hereby incorporated by reference into the disclosure of this invention.

FIELD OF THE INVENTION

The invention relates generally to the field of vertical cavity surface emitting lasers and more particularly, to efficient reception of diffracted laser light.

BACKGROUND OF THE INVENTION

FIG. 1, shows a conventional edge emitting laser diode 10 that is attached to a carrier 12 which is mounted on a substrate 14. A photo sensor 16 is generally placed under the rear surface/rear mirror 18 of the edge emitting laser 10. In most systems utilizing semiconductor lasers, dynamic stabilization and control of the optical output power is required. In edge emitting laser diodes this is usually accomplished by allowing a portion of the light 20 emitted by the laser diode, i.e., using light emitted from the laser diode's rear mirror 18 for bias control, to illuminate the photo sensor 16 which produces a photocurrent proportional to the intensity of a beam of light 22 emitted by the edge emitting laser diode 10. This optically generated photocurrent, in turn drives a feedback circuit which controls the laser bias current. In contrast, however, in an optical package utilizing a VCSEL, light emitted from the rear mirror is absorbed by the GaAs substrate used in the VCSEL. Thus, the system of using light emitted from the rear mirror is unavailable for bias control in VCSEL structure.

A VCSEL is a semiconductor laser diode in which the laser oscillation and the optical emission occur in a direction normal to the pn junction plane. The VCSEL has many properties which are advantageous when compared to the more commonly used edge-emitting laser diodes. These properties include: low optical beam divergence, a circular optical output, and single longitudinal mode operation. In addition, VCSEL devices are manufactured in a manner which allows wafer level testing of individual devices. These properties make VCSELs attractive in applications such as optical data storage, data communication and laser scanners.

Presently, in a VCSEL structure, a portion of the light beam emitted from the front surface of the laser is redirected by a reflective surface onto a photo-sensing unit for automatic power control. Therefore, the proper alignment of the laser with the reflective surface is important in redirecting the portion of the light beam onto the photo-sensing unit. The VCSEL laser is placed on an adhesive material for attachment to a carrier. It has been realized that due to the nonuniform thickness of the adhesive material and the lack of precision in placement of the VCSEL on the adhesive material, the VCSEL may be tilted in a certain direction, thereby adversely changing the alignment between the VCSEL and the reflective surface.

Thus, there is a need for the elimination of the tilt angle between the carrier and the laser diode mounted thereon.

DETAILED DESCRIPTION OF THE PREFERRED EMBODIMENT

The present invention provides a method and apparatus for eliminating tilt angle between an optical emitter mounted on a carrier in an optical package.

It has been proposed that, for bias control, a portion of the light emitted from the surface of the laser diode can be diffracted from a holographic optical element and directed onto an optical sensing unit located near the laser diode. However, it has been realized that the precision of the angle of diffraction is important to the efficient reception of said portion of the light by the optical sensing unit. One of the factors affecting the angle of diffraction of the light from the holographic optical element is the physical arrangement of the laser diode relative to the header upon which it is mounted. Hence, changing the tilt angle between the header and the laser diode will result in a change in the direction of the light emitted from the laser diode onto the holographic element, thereby affecting the angle of diffraction of said portion of the light directed onto the optical sensing unit.

Figure 1:
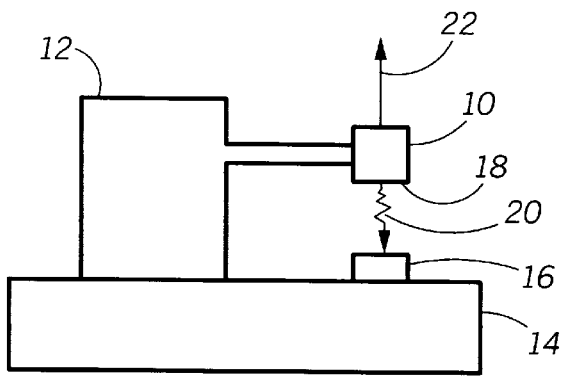
FIG. 1 is a schematic representation of a conventional edge emitting laser with a photo sensor for bias control.
Figure 2:
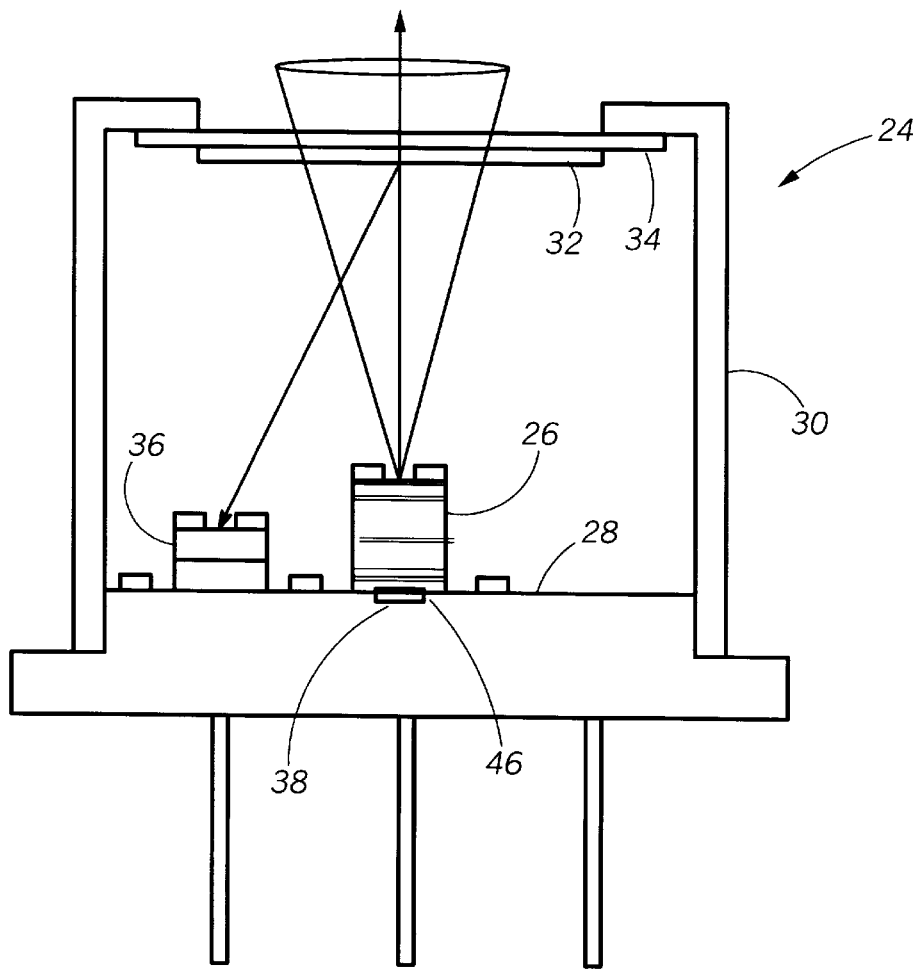
FIG 2 is a schematic representation of an optical package illustrating) the light diffracted from a holographic element onto an optical sensing unit in a device in accordance with the present invention.

FIG. 2 illustrates generally an optical package 24 including an optical emitter 26, a carrier in the form of a header 28, a can lid 30, a partially reflective optical element such as a holographic element 32, a glass member 34, and an optical sensing unit 36. The optical emitter may be a laser element such as a Vertical Cavity Surface Emitting Laser "VCSEL". As shown in FIG. 2, the light emitting from the VCSEL 26 is incident upon the partially reflective optical element/holographic element 32 which diffracts and directs a portion of the emitted light onto the optical sensing unit 36. The alignment of the laser element, namely, the VCSEL 26, and the holographic element 32 is important since the direction of the diffracted light is dependent on the angle of the incident light upon the holographic element 32. Any slight tilt of the VCSEL will result in a change in the incident angle of the light upon the holographic element 32. Hence, it is important to reduce and eliminate the tilt angle of the VCSEL 26.

Figure 3:
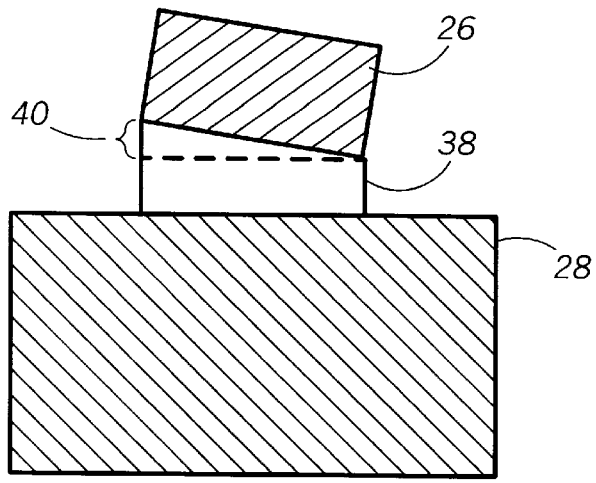
FIG. 3 is a schematic representation of a conventional arrangement of an optical emitter mounted on a header.

FIG. 3 shows a schematic representation of a conventional arrangement of an optical emitter 26 mounted on a header 28. The optical emitter or the VCSEL 26 is mounted on the header 28 using an adhesive material 38. The adhesive material is typically epoxy (ethylene oxide or trimethylene oxide). The thickness of the adhesive material 38 and the placement of the VCSEL 26 on top of the adhesive material 38 are factors that affect the proper alignment of the VCSEL 26 with the header 28. In the event that the thickness of the adhesive material is not uniform or the placement of the VCSEL 26 on top of the adhesive material is not precisely controlled, there may be a tilt angle 40 between the VCSEL 26 and the header 28. The VCSEL to header tilt angle 40 of approximately one degree changes the angle of the incident light upon the holographic element 32. The tilt angle 40 will adversely affect the direction of the diffracted portion of the light onto the optical sensing unit 36.

Figure 4:
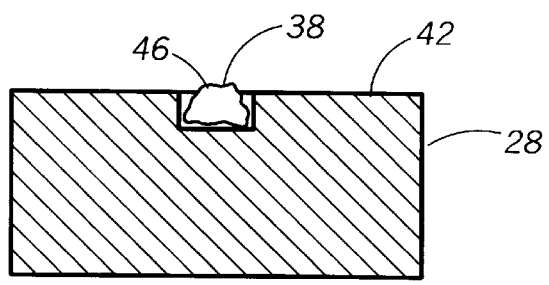
FIG. 4 is a schematic representation of a header having a cavity formed in the top surface thereof in accordance with the present invention.
Figure 5:
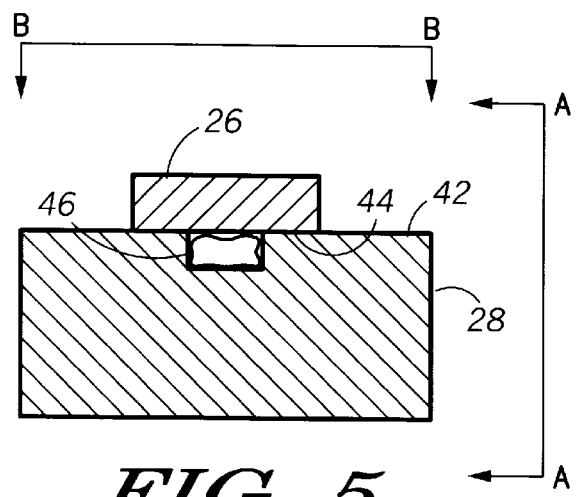
FIG. 5 is a schematic representation of an article of manufacture in accordance with the present invention.

As shown in FIGS. 4 and 5, in order to eliminate the tilt angle 40 between the VCSEL 26 and the carrier in the form of the header 28, the present invention provides for the direct placement of the VCSEL 26 on the top surface 42 of the header 28 such that the rear surface 44 of the VCSEL 26 and the top surface 42 of the header 28 are in intimate contact. As shown in FIGS. 4 and 5, the present invention provides for a cavity 46 formed on the top surface 42 of the header 28 wherein an amount of adhesive material 38 is inserted therein to make contact with the rear surface 44 of the VCSEL 26 which at least partially covers said cavity. As will be described below in more detail, with reference to FIGS. 6 and 7, in one aspect of the present invention there is provided at least one egress point 48 such that any excess amount of adhesive material 38 can overflow outside of the cavity 46. This eliminates the need for a controlled process of measuring the precise amount of the adhesive material needed to fill-in the cavity 46. Therefore, an amount of adhesive material 38 larger than the volume of the cavity 46 can always be provided, wherein the excess amount of the adhesive material 38 would overflow from the egress point 48 and discarded. This approach reduces the probability of inserting an insufficient amount of adhesive material 38 into the cavity 46.

FIG. 5 is a schematic representation of an article manufacture in accordance with the present invention. Referring to FIG. 5, VCSEL 26 is mounted on the top surface 42 of the header, and the rear surface 44 of the VCSEL is in direct contact with the adhesive material 38 in the cavity 46. In placing the VCSEL 26 in intimate contact with the top surface 42 of the header and eliminating the interposing thickness of the adhesive material 38 between the VCSEL 26 and the header 28, the tilt angle 40 between the VCSEL 26 and the header 28 is eliminated.

Figure 6:
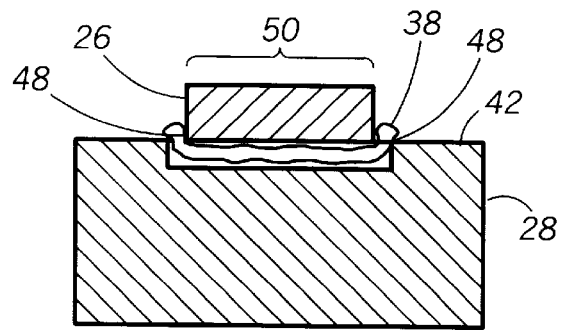
FIG. 6 is a cross-sectional side view of the article of manufacture shown in FIG. 5 along line A—A.

FIG. 6 illustrates the cross-sectional side view of the article of manufacture in accordance with the present invention taken along line A—A of FIG. 5. As shown in FIG. 6, the opening of the cavity 46 is wider than the width 50 of the VCSEL 26 such that at least one egress point 48 is provided for the overflow of the adhesive material 38 outwardly and away from the VCSEL 26 when the VCSEL 26 is placed upon the opening of the cavity on the top surface 42 of the header. This arrangement advantageously provides for the overflow of the adhesive material 38 away from the VCSEL 26. This is in contrast with the conventional approach wherein during the placement of the VCSEL 26 upon the layer of adhesive material 38, the VCSEL could submerge into the adhesive material, thereby causing the undesirable effect of covering the top surface of the VCSEL with adhesive material.

Figure 7:
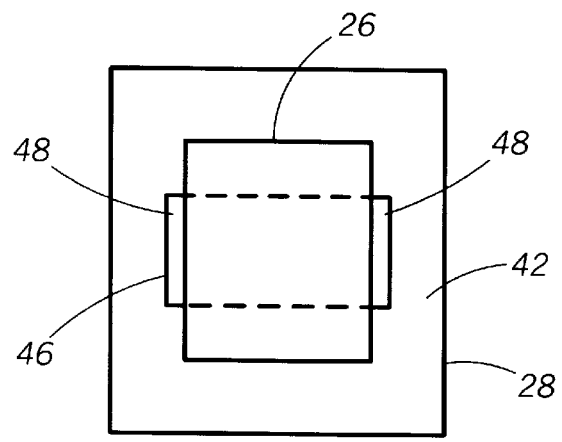
FIG. 7 is a plan view of the article of manufacture shown in FIG. 5 along line B—B.

FIG. 7 illustrates the plan view of the article of manufacture in accordance with the present invention taken along line B—B of FIG. 5. Referring to FIG. 7, the VCSEL 26 is positioned on the top surface 42 of the header, covering the opening of the cavity 46. Two points of egress 48 extending on both sides of the VCSEL 26 allow the excess adhesive material to overflow out of the cavity 46 as the VCSEL 26 imparts pressure on the adhesive material 38 present in the inside of the cavity 46.

Figure 8:
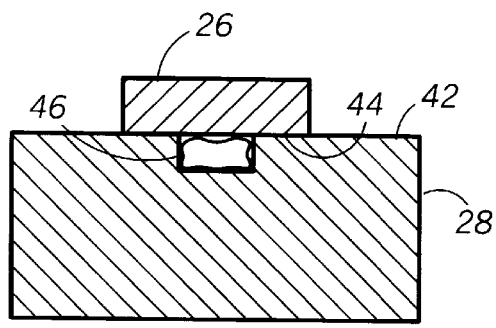
FIG. 8 is a schematic representation of an article of manufacture in accordance with another aspect of the present invention.

Another aspect of the present invention is illustrated in FIG. 8. In this aspect, the optical emitter 26 is placed on the top surface 42 of the header 28 such that the entire opening of the cavity 46 is covered. This arrangement does not provide any egress points 48. The adhesive material is provided in the cavity 46 in a precise and controlled amount such that as the optical emitter is placed in intimate contact with the top surface of the header 28, the adhesive material 38 is compacted into the cavity 46, thereby reducing or eliminating the tilt angle between the header 28 and the optical emitter 26.

Figure 9:
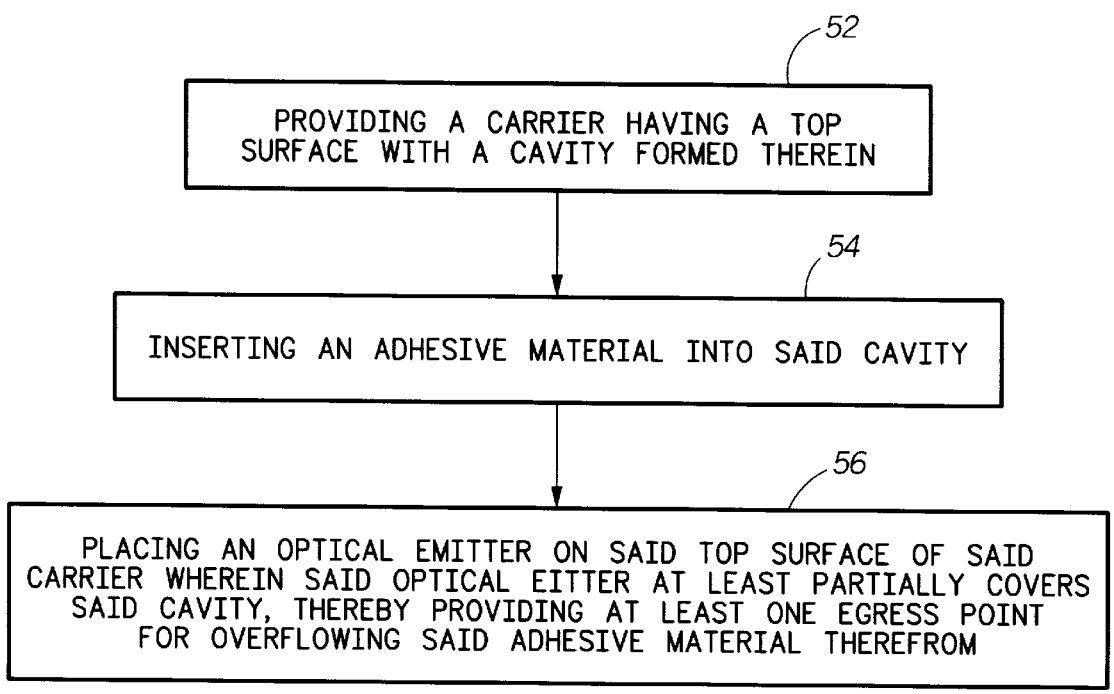
FIG. 9 is a flow chart showing one embodiment of steps in accordance with the present invention.

FIG. 9 is a graphic representation of one embodiment of steps of a method in accordance with the present invention. The method includes the steps of: a) providing a carrier having a top surface with a cavity formed therein 52; b) inserting an adhesive material into said cavity 54; and c) placing an optical emitter on said top surface of said carrier wherein said optical emitter at least partially covers said cavity, thereby providing at least one egress point for overflowing said adhesive material therefrom 56.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A method of eliminating tilt angle between a carrier and an optical emitter mounted thereon, comprising the steps of:

a) providing a carrier having a top surface with a cavity formed therein;

b) inserting an adhesive material into said cavity; and c) placing an optical emitter on said top surface of said carrier wherein said optical emitter partially covers said cavity, thereby providing at least one egress point for overflowing said adhesive material therefrom.

2. The method of claim 1, wherein said carrier is a header.

3. The method of claim 1, wherein said optical emitter is a laser element.

4. The method of claim 3, wherein said laser element is a vertical cavity surface emitting laser.

5. An article of manufacture for an optical package, comprising:

a) a carrier having a top surface with a cavity formed therein;

b) an adhesive material inserted into said cavity; and c) an optical emitter placed on said top surface of said carrier wherein said optical emitter partially covers said cavity, thereby providing at least one egress point for overflowing said adhesive material therefrom.

6. The article of claim 5, wherein said carrier is a header.

7. The article of claim 5, wherein said optical emitter is a laser element.

8. The article of claim 7, wherein said laser element is a vertical cavity surface emitting laser.

9. An optical package, comprising:

a) a header having a top surface with a cavity formed therein;

b) an adhesive material inserted into said cavity, c) an optical emitter placed on said top surface of said header wherein said optical emitter partially covers said cavity, thereby providing at least one egress point for overflowing said adhesive material therefrom;

d) a partially reflective optical element for diffracting a predetermined beam of light emitted from said optical emitter; and e) an optical sensing unit responsive to said predetermined beam of light.

* * * * *